United States Patent
Hur et al.

(10) Patent No.: US 7,724,602 B2
(45) Date of Patent: May 25, 2010

(54) MEMORY CONTROLLER WITH PROGRAMMABLE REGRESSION MODEL FOR POWER CONTROL

(75) Inventors: Ibrahim Hur, Austin, TX (US); Calvin Lin, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 11/775,517

(22) Filed: Jul. 10, 2007

(65) Prior Publication Data

US 2009/0016137 A1    Jan. 15, 2009

(51) Int. Cl.
*G11C 5/14* (2006.01)

(52) U.S. Cl. .................. 365/226; 365/227; 365/194; 710/309; 711/158; 713/322

(58) Field of Classification Search ................ 365/226, 365/227, 194, 230.08, 230.03; 710/309; 711/158; 713/321, 322
See application file for complete search history.

(56) References Cited

U.S. PATENT DOCUMENTS

| 5,835,435 | A * | 11/1998 | Bogin et al. ................ 365/227 |
| 7,334,144 | B1 | 2/2008 | Schlumberger |
| 2005/0027952 | A1 * | 2/2005 | Mayo et al. ................. 711/158 |
| 2006/0064532 | A1 | 3/2006 | Hur |
| 2006/0112240 | A1 * | 5/2006 | Walker et al. ............... 711/154 |

* cited by examiner

*Primary Examiner*—Tuan T Nguyen
*Assistant Examiner*—Toan Le
(74) *Attorney, Agent, or Firm*—Diana R. Gerhardt; Jack V. Musgrove

(57) ABSTRACT

A memory controller uses a throttling mechanism which estimates a throttling delay for achieving a target power consumption, and periodically blocks all memory commands for a number of clock cycles corresponding to the throttling delay. Idle memory ranks of the memory device are powered down while the memory commands are blocked. A regression model bases the throttling delay on a plurality of operating factors and a plurality of regression coefficients for the operating factors. In the illustrative implementation the operating factors include power consumption, a current number of bank conflicts, a current number of read commands, and a current number of write commands. Different sets of regression coefficients can be programmably stored for use with different system configurations.

20 Claims, 6 Drawing Sheets

MEMORY CONTROLLER WITH PROGRAMMABLE REGRESSION MODEL FOR POWER CONTROL

CROSS-REFERENCE TO RELATED APPLICATION

This application is related to U.S. patent application Ser. No. 11/775,493 entitled "DRAM POWER MANAGEMENT IN A MEMORY CONTROLLER" filed concurrently herewith.

BACKGROUND OF THE INVENTION

1. Field of the Invention

The present invention generally relates to power management in data processing systems, and more particularly to a method of controlling power usage of a memory structure such as dynamic, random-access memory (DRAM).

2. Description of the Related Art

Power usage has become a dominant concern in the development of data processing systems. Excess power usage is not only costly and inefficient, but also leads to heat management problems. These problems are particularly pronounced in computer systems having large amounts of memory, such as server systems. Servers typically use dynamic random-access memory (DRAM) which is preferable over other memory structures such as static random-access memory (SRAM) because DRAM is more dense. However, DRAM is much more power intensive. SRAM uses a flip-flop memory cell but DRAM uses a capacitor-based memory cell which, due to current leakage, must be regularly refreshed. DRAM can consume up to 45% of a system's overall power.

Power optimization techniques for memory subsystems can generally be classified into three categories: hardware-based methods (implemented within a memory controller), software-directed techniques (compiler or operating system), and hybrid approaches. A basic hardware mechanism for reducing power is to put memory devices into a low-power mode when they are idle. Unfortunately, the overuse of this mechanism can limit performance as there are associated entrance and exit latencies for a particular low power mode. More intelligent memory controllers have been devised which use schedulers in conjunction with power-down commands. Their goal is to try to match predicted idle time with a low-power mode that has the appropriate latency to resume activity. Variations of this approach basically monitor usage of memory sections (ranks) and move to a different power level if the usage exceeds a threshold level. Since threshold values are system- and application-dependent, the algorithms are difficult to tune. These hardware-based approaches for power savings assume in-order scheduling of the memory commands.

Compiler-directed approaches aim to group memory accesses to the same memory sections to increase the size of idle periods. This goal is achieved by loop transformations, data layout optimizations, instruction scheduling, or a combination of these methods. In cacheless single-processor systems, compile-time techniques can help the memory controller make better predictions for idle periods of memory sections, but in systems with multi-level caches or with shared memory controllers the role of the compiler for power savings is limited.

Operating system (OS) support for power savings may be implemented as a first order design criteria, for example, by shutting down unused system components to save energy. By controlling the set of physical devices that are in active use, the actual power consumption for their access can be controlled by putting inactive devices into low-power mode. This approach has been used to change the size of allocated memory for processes by tracking page miss rate versus memory size curve. Other OS-based approaches rely on improving the placement of data in physical memory. Better page allocation policies can save energy; for example, by allocating new pages to memory that is already in use (or using page migration), the number of active memory devices can be kept to a minimum. One OS performance optimization is the activation of memory used by a newly scheduled process during a context switch, which largely hides the latency of exiting low-power mode. Another OS-based approach reshapes memory traffic at the page granularity. However, with the use of large page sizes, OS-based techniques which require data migration may degrade performance considerably. Any approach that minimizes the number of active memory devices also reduces the available memory bandwidth which can adversely affect performance. Accesses previously performed in parallel to different memory devices may need to be performed serially to the same memory device.

Hybrid approaches propose a cooperative software-hardware mechanism that tracks process-specific idle periods to exploit low-power modes for ranks of DRAM devices. Processor and DRAM power can be jointly managed by attempting to maximize system performance for a given total power budget, which is particularly useful when either the CPU or DRAM is significantly less utilized than the other. These approaches are not transparent to software and so can entail significant programming difficulties.

Memory controllers have also been devised which attempt to optimize memory performance without relying on low-power modes. These controllers use intelligent schedulers to reorder memory commands. FIG. 1 depicts an example of such a memory controller 10 which uses a plurality of arbiters 12 to reorder commands based on counts of read commands and write commands. Incoming memory commands (read or write) are stored in reorder queues 14, and a selector 16 keeps track of read command count (Rcnt), write command count (Wcnt), and a count of the number of cycles elapsed since the last arbiter selection (Ccnt). Firmware 18 stores setup information and control instructions to dynamically select the most appropriate read/write arbiter from among arbiters 12 based on the current read/write pattern (ratio). The selected arbiter then determines the next command to be sent to the memory array. Arbiter selection is repeated periodically, i.e., when Ccnt reaches a predetermined count. In a system where bank conflicts cause long delays, some commands in reorder queues may be blocked until conflicts related to those commands are resolved.

While memory schedulers that reorder commands can significantly improve performance, they are unfortunately at odds with memory schedulers that use power-down modes. For optimal performance, a reorder scheduler typically selects commands that avoid hardware conflicts, essentially spreading the commands across many physical memory devices. However, to reduce power consumption, a power-aware scheduler would cluster commands to a subset of the physical devices, allowing one or more of them to be put into low-power mode. It would, therefore, be desirable to devise an improved memory controller which could optimize performance while still taking advantage of low-power modes. It would be further advantageous if the controller could be used to minimize performance degradation for a given power budget.

SUMMARY OF THE INVENTION

It is therefore one object of the present invention to provide an improved memory controller to manage power in a memory subsystem such as DRAM.

It is another object of the present invention to provide such a memory controller that can balance power reduction and performance reduction.

It is yet another object of the present invention to provide a mechanism for a memory controller to accurately estimate a throttling delay necessary to achieve a power consumption target.

The foregoing objects are achieved in a method of managing power usage of a memory device by setting a target power consumption for the memory device, estimating a throttling delay for achieving the target power consumption, periodically blocking memory commands for a number of clock cycles corresponding to the throttling delay, and powering down idle ranks while the memory commands are blocked. A regression model bases the throttling delay on a plurality of operating factors and a plurality of regression coefficients for the operating factors. In the illustrative implementation the operating factors include power consumption, a current number of bank conflicts, a current number of read commands, and a current number of write commands. Different sets of regression coefficients can be programmably stored for use with different system configurations.

The invention may advantageously be used in combination with a power- and performance-aware scheduler which determines power priorities for the memory commands, reorders the memory commands for dispatch to the memory device based on the power priorities, and powers down one or more further selected memory ranks based on rank localities of the reordered commands.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to power management for memory subsystems of data processing systems, and is accordingly usable in a wide variety of such systems including general-purpose computers, distributed computing environments or special-purpose devices. The invention is applicable to memory arrays having various functions such as central (system) memory or local cache memory, and may be further implemented with any type of memory structure but is particularly advantageous for those memory technologies which require higher power consumption like DRAM and variations thereof such as synchronous DRAM (SDRAM).

Figure 2:
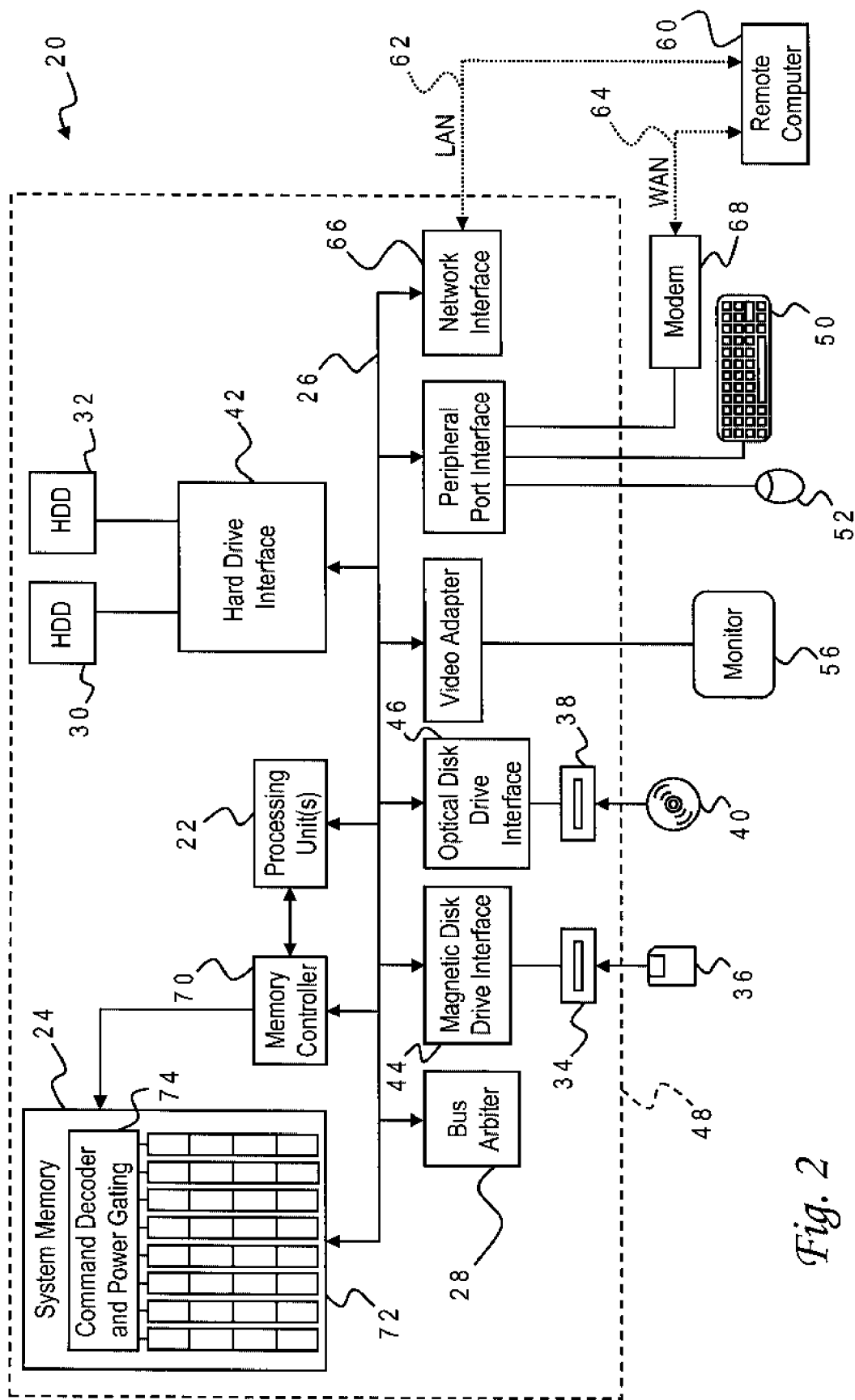
FIG. 2 is a block diagram of one embodiment of a computer system constructed in accordance with the present invention, having a memory controller which transmits commands to a memory array.

With reference now to the figures, and in particular with reference to FIG. 2, there is depicted one embodiment 20 of a computer system constructed in accordance with the present invention. Computer system 20 may for example be a server system adapted to provide computing services across a network such as the Internet. Computer system 20 is generally comprised of one or more processing units 22, a system memory 24, and a system interconnect fabric 26 that couples system memory 24 to processing unit(s) 22 and other components of data processing system 20. Commands on system interconnect fabric 26 are communicated to various system components under the control of bus arbiter 28.

Computer system 20 further includes a first hard disk drive 30, a second hard disk drive 32, a magnetic disk drive 34 to read from or write to a removable disk 36, and an optical disk drive 38 for reading from or writing to optical disk 40. First hard disk drive 30, second hard disk drive 32, magnetic disk drive 34, and optical disk drive 38 are communicatively coupled to system interconnect fabric 26 by a hard disk drive interface 42 which contains an arbiter for selecting between communications directed to first hard disk drive 30 and second hard disk drive 32, a magnetic disk drive interface 44, and an optical drive interface 46, respectively. Other types of media which are readable by a computer, such as magnetic cassettes, universal serial bus (USB) flash cards, digital video disks, Bernoulli cartridges, and other later-developed hardware may also be used in the exemplary computer operating environment (with corresponding ports/interfaces). The foregoing components of computer system 20 (except for the removable disks) reside in a common chassis 48. The drives and their associated computer-readable media provide non-volatile storage for computer system 20, which may include program instructions and operand data for carrying out portions of the present invention While parts of the invention are described in the general context of instructions residing on hardware within a computer, those skilled in the art will recognize that the invention may also be implemented in a combination of program modules running on an operating system of the computer.

A user enters commands and information into computer system 20 through a keyboard 50 and pointing device 52 (e.g., mouse). Other input devices (not shown) may include a microphone, joystick, game pad, satellite dish, infrared sensor, or a scanner. These and other input devices may be connected to processing unit 22 through a peripheral connect interface (PCI) 54 that is coupled to system interconnect fabric 26. A monitor 56 or other type of display device is connected to system interconnect fabric 26 via a video adapter 58. Computer system 20 may further include other peripheral output devices (not shown) such as speakers or printers.

Computer system 20 operates in a networked environment using logical connections to one or more remote computers, such as a remote computer 60. Remote computer 60 may be another server, a router, a client (e.g., personal computer), or other common network node. The logical connections depicted in FIG. 2 include connections over a local area network (LAN) 62 and a wide area network (WAN) 64. Computer system 20 is coupled to LAN 62 via a network interface 66 in communication with system interconnect fabric 26, and coupled to WAN 64 via a modem 68 connected to PCI 54.

System memory 24 is used to store various software and data structures such as an operating system (OS), application program modules, compilers, utilities, and program data (input and output). Commands to system memory 24 are handled by a memory controller 70 connected to system interconnect fabric 26. There may be multiple ports between memory controller 70 and system memory 24. In this example system memory 24 includes eight ranks 72 of memory, wherein each rank consists of four banks of replaceable memory chips, addressable by memory controller 70. Memory controller 70 has the ability to compute the port, bank, and rank numbers for any memory commands. System memory 24 includes a command decoder 74 which receives the commands from memory controller 70 and carries out the reads/writes from/to system interconnect fabric 26, and which further gates power to selected memory ranks 72 in response to an addressed power-down command, i.e., the selected ranks can be placed into a low-power mode. System memory 24 effectuates the low-power mode in DRAM chips by registering the clock signal as logical LOW.

Figure 1:
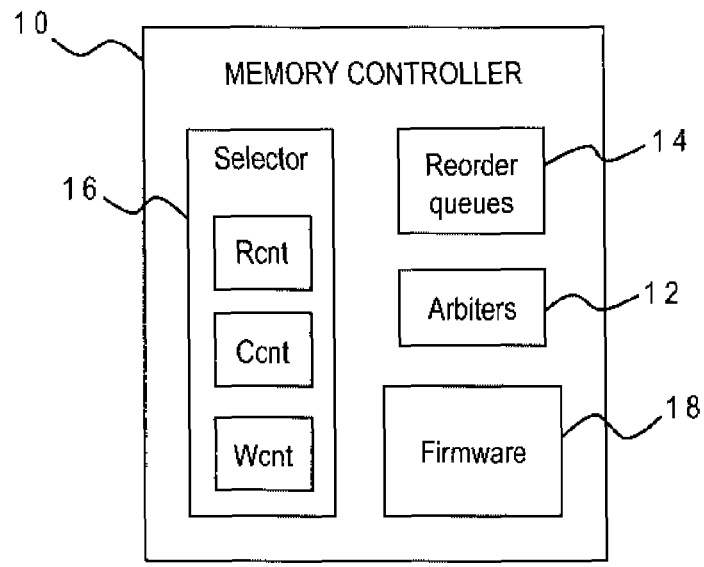
FIG. 1 is a block diagram of a conventional memory controller for a memory subsystem, having a scheduler which optimizes performance based on read/write ratios.
Figure 3:
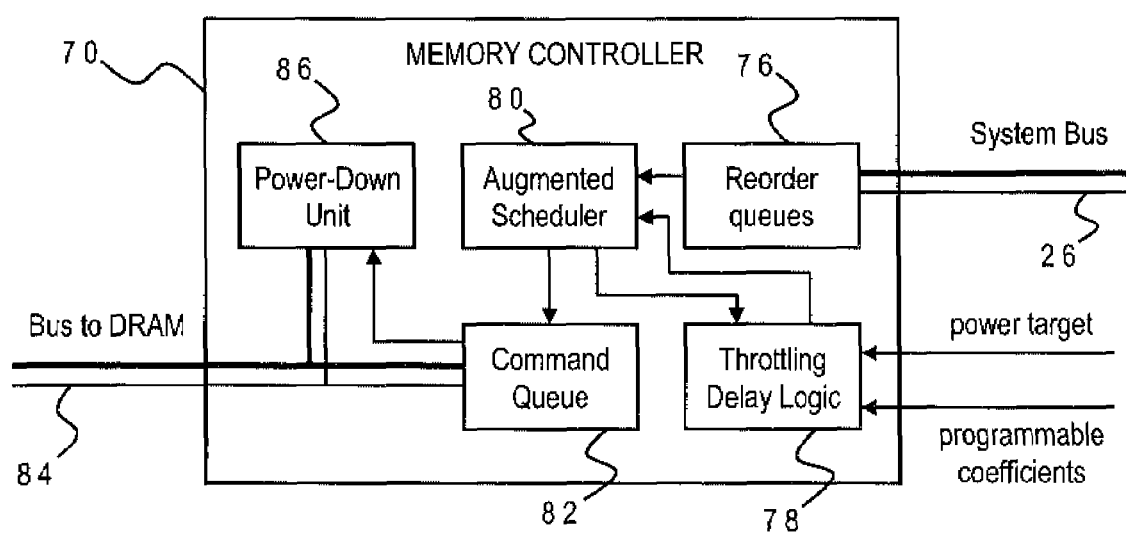
FIG. 3 is a block diagram of one embodiment of the memory controller used in the computer system of FIG. 2, constructed in accordance with the present invention.

Memory controller 70 is shown in further detail in FIG. 3 and includes reorder queues 76 that receive memory commands from system interconnect fabric 26, throttling delay logic 78 that calculates any desired throttling delay, an augmented scheduler 80 that reorders the memory commands to optimize performance and power usage, a command queue (or centralized arbiter queue, CAQ) 82 that receives the reordered commands from augmented scheduler 80 and transmits them along another bus 84 to system memory 24, and a power-down unit that tracks the current commands and issues a power-down command to system memory 24 as explained further below. There are at least two reorder queues (one each for read commands and write commands) but there could be more than two; for example, a third reorder queue could be used for prefetch commands. Each reorder queue may, for example, have eight entries. CAQ 82 is first-in, first-out (FIFO), i.e., the commands from CAQ 82 are issued to system memory 24 in the same order that they were placed into CAQ 82 by augmented scheduler 80. In the exemplary embodiment CAQ 82 has four entries.

Figure 4:
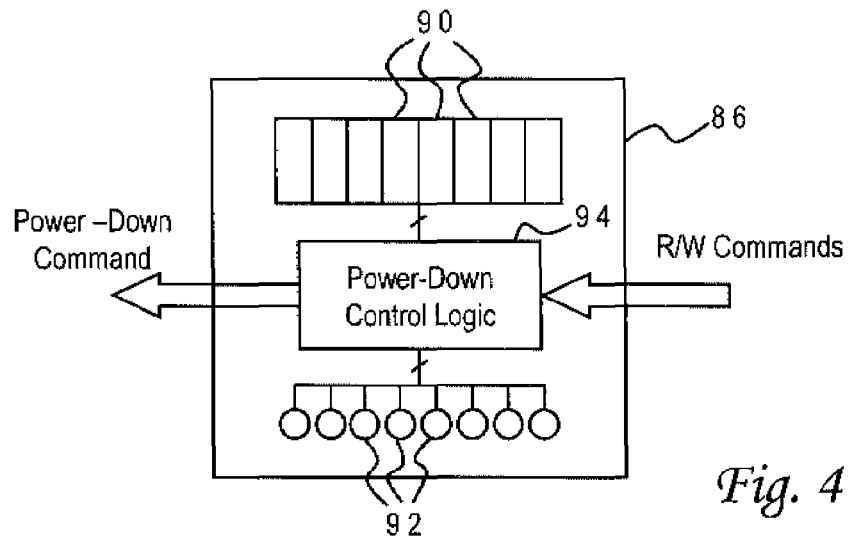
FIG. 4 is a block diagram of one embodiment of the power-down unit used in the memory controller of FIG. 3, constructed in accordance with the present invention.

Every command on bus 84 has a command type (e.g., read, write) and an associated address. Memory controller 70 introduces a new type of power-down command issued by power-down unit 86 in which the rank to be powered down is encoded in the address bits. Power-down unit 86 is shown in further detail in FIG. 4 and includes a set of low-power bits 90 and a set of idle counters 92. There is one low-power bit 90 and one idle counter 92 for each rank 72 of system memory 24. A low-power bit is set (to logical one or high voltage) when the corresponding rank is placed into low power mode. An idle counter 92 maintains the number of cycles remaining until the corresponding rank becomes idle. Each time a regular command (i.e., read or write) is sent to any bank of a powered-down rank, that rank's counter 92 is initialized to the maximum of its current value and the latency of the new command. A command's latency is known based on its associated rank, port and command type compared with currently executing commands, and is specific to the particular type of memory, e.g., DDR versus DDR-2, according to manufacturer specifications.

The overuse of power-down commands can potentially degrade performance in several ways. Power-down commands consume command bus bandwidth, and there will be unnecessary switches between low and high power modes in DRAM which will waste at least two DRAM cycles. Additionally, in most modern DRAM chips when a rank enters low power mode it must stay in that mode for a certain number of cycles. Thus, powering down a rank prematurely can increase the latency for memory commands waiting for the powered-down rank. Memory controller 70 accordingly uses a novel protocol to decide when to send a power-down command to system memory 24 and avoid these problems. At every cycle of the system clock, the power-down control logic 94 within power-down unit 86 checks low-power bits 90, idle counters 92, and the commands waiting in CAQ 82. A power-down command is sent based on rank localities of the reordered commands, when the following conditions occur: (i) the idle counter for the rank is zero, which indicates that the rank is currently idle; (ii) the low-power bit for the rank is zero (i.e., it is not already powered down), because otherwise a new power-down command for the rank would be redundant and unnecessarily occupy the command bus; (iii) there is no command for the rank pending in the CAQ, which avoids powering down a rank when a read or write command to that rank is imminent; and (iv) the command at the front of CAQ 82 (i.e., the currently pending command) cannot be issued in this clock cycle. The power-down command is sent from power-down unit 86 to system memory 24 along command bus 84 and decoded by command decoder and power gating logic 74. To reduce performance degradation, power-down unit 86 gives priority to regular commands over power-down commands.

Figure 5:
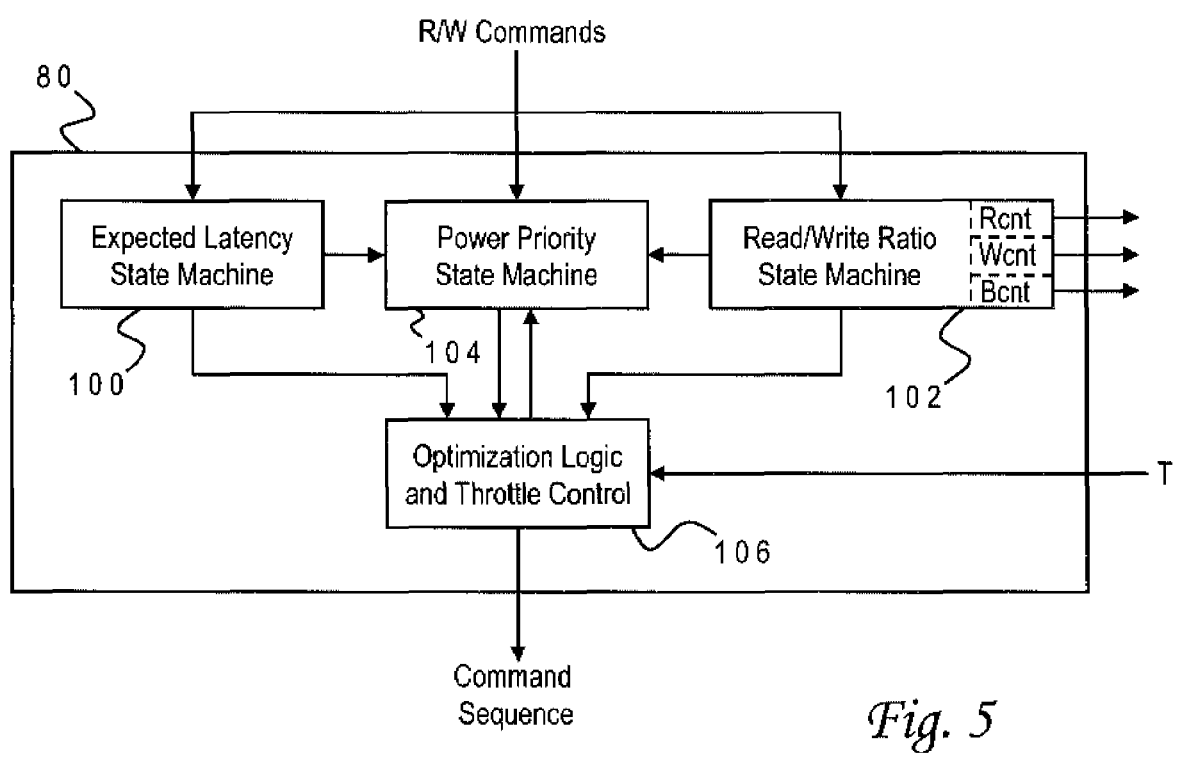
FIG. 5 is a block diagram of one embodiment of the augmented scheduler used in the memory controller of FIG. 3, constructed in accordance with the present invention.

Commands are placed in CAQ 82 by augmented scheduler 80 which is shown in further detail in FIG. 5. Augmented scheduler 80 includes an expected latency state machine 100, a read/write ratio (command pattern) state machine 102, a power priority state machine 104, and optimization logic and throttle control 106. Each of the state machines receives read/write commands from reorder queues 76 and reorders the commands based on different criteria. Expected latency state machine 100 reorders commands to minimize the latencies of the scheduled memory commands (a performance criterion). The expected latency of the available commands is used to avoid hardware conflicts and thus exhibit low latency. Read/write ratio state machine 102 reorders commands based on the history of recently scheduled memory commands (also a performance criterion), and includes a read command counter (Rcnt) and a write command counter (Wcnt). Read/write ratio state machine 102 observes the recent command pattern and periodically chooses the most appropriate one of three history-based schedulers. By scheduling commands to match an expected ratio of read and write operations, the scheduler avoids bottlenecks that arise from uneven read and write reorder queues. Power priority state machine 104 reorders commands based on the locality of the ranks 72 which they address (a power criterion).

Previous hardware-based approaches for power savings required in-order scheduling of the memory commands, but power priority state machine 104 reorders commands to optimize power while simultaneously preserving performance. By grouping commands for the same rank as closely as possible in the CAQ, the number of power-down operations is reduced while providing the same level of power savings. In the illustrative embodiment, power priority state machine 104 gives the highest priority to the set of commands having the same rank as the last command sent to CAQ 82 (power priority state machine 104 maintains a history of the last sequence of commands dispatched by optimization logic and throttle control 106). The set of commands having the same rank as the second from the last command in CAQ 82 are given the second priority, and so forth.

Figure 6:
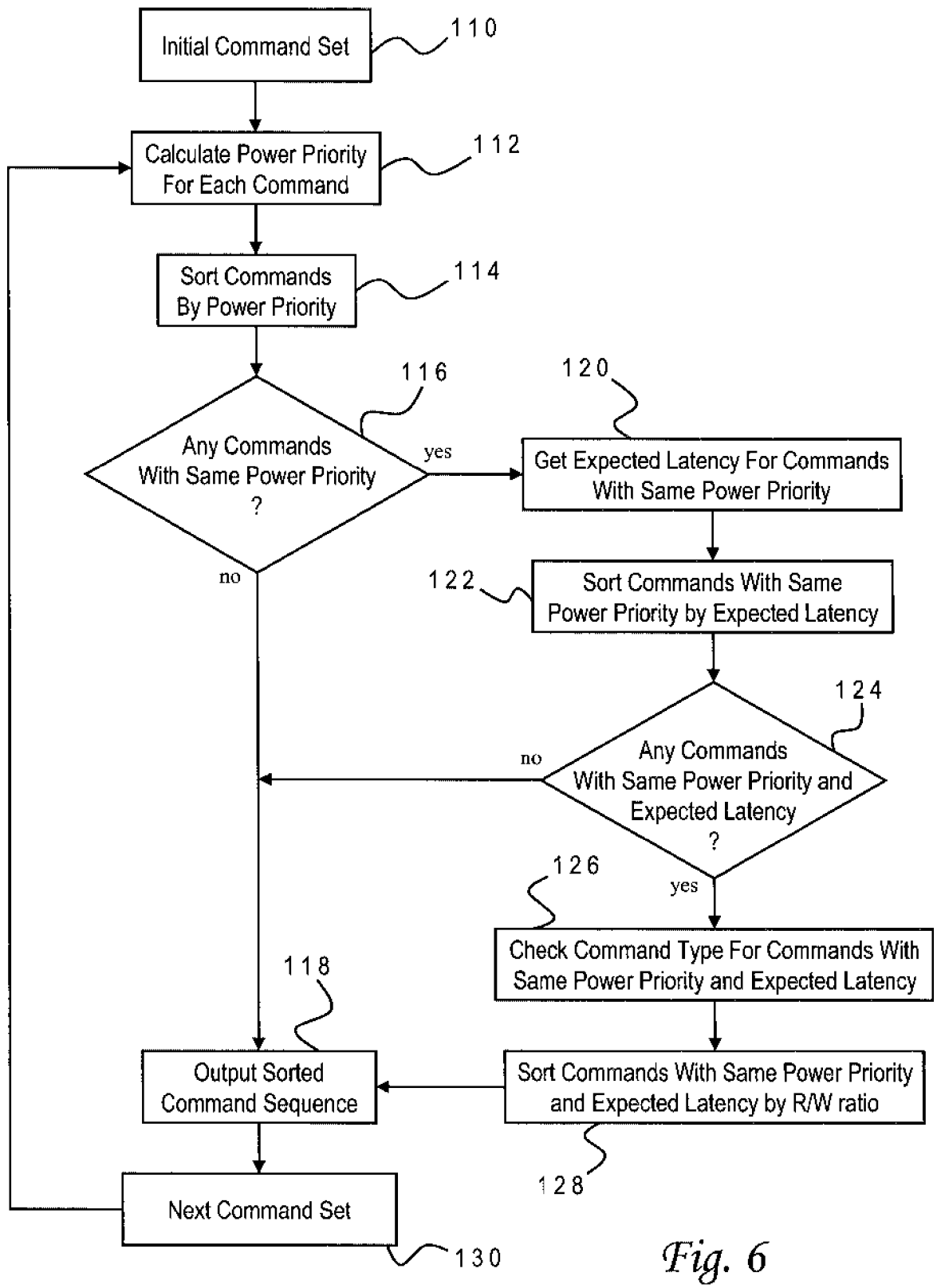
FIG. 6 is a flow chart illustrating command reordering by the power priority finite state machine used in the augmented scheduler of FIG. 5, in accordance with one implementation of the present invention.

Since there may be more than one command in each of these priority sets, power priority state machine 104 further sorts within the sets using performance criteria. FIG. 6 illustrates the logical flow of command reordering by the power priority state machine. The process begins with an initial memory command set from the reorder queues (110). The power priority for each command is determined based on its rank (112). The commands in the initial set are then sorted by power priority (114). The process determines whether any commands have the same priority, i.e., are tied (116). If there are no ties in power priority, the process outputs the originally sorted list of commands (118). If there are commands with the same power priority, the expected latencies for those commands are retrieved from the expected latency state machine (120), and tied commands are resorted by that parameter (122). The process then determines whether any commands have both the same power priority and the same expected latency (124). If there are no such ties, the process outputs the twice-sorted list of commands (118). If there are commands having both the same power priority and the same expected latency, the commands are further checked as to command type (read or write) (126), and given priority within a tied set of commands based on a desired read/write ratio from the read/write ratio state machine (128). The process then outputs the thrice-sorted list of commands (118), and repeats for the next command set (130).

Expected latency state machine 100 and read/write ratio state machine 102 can similarly use the other state machines to break any ties in the reordering of commands. For example, expected latency state machine 100 can further reorder commands having the same latency by first balancing the read/write ratio, then by using the port number, and finally by using the power criterion (rank number), and read/write ratio state machine 102 can further reorder commands having the same read/write mix by first using the expected latency, then by using the port number, and finally by using the power criterion.

Because performance and power goals are both important, optimization logic and throttle control 106 probabilistically combines the three state machines to produce a scheduler that encodes all goals. Each criterion (state machine) is given a weight based on two threshold values, and these threshold values are compared to a periodically generated random (or pseudo-random) number to select one of the three state machines for outputting the command sequence to CAQ 82.

Figure 7:
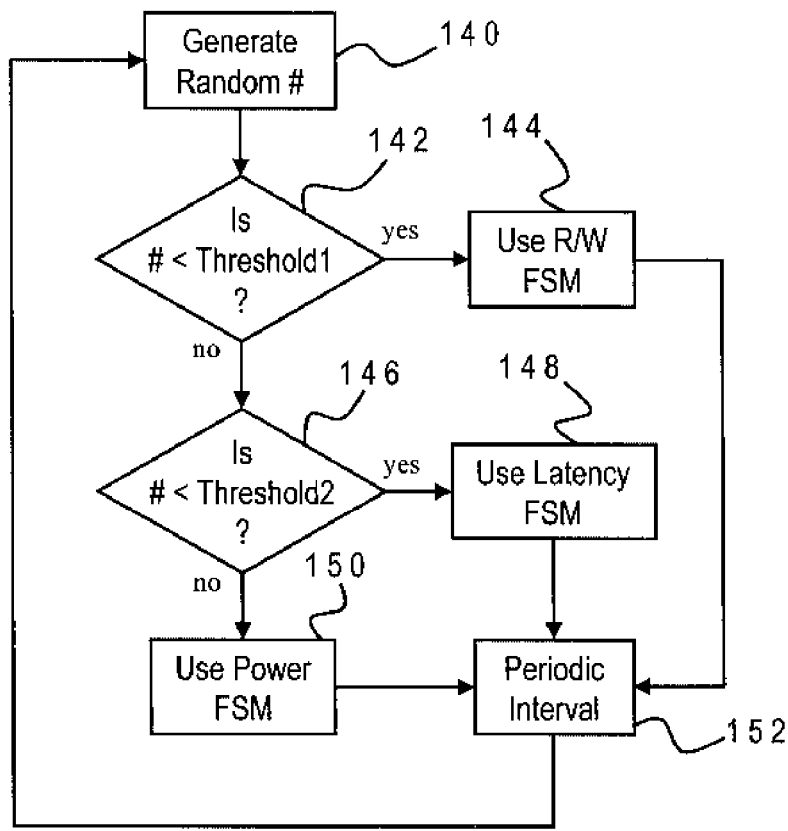
FIG. 7 is a flow chart illustrating the probabilistic combination of different state machines by optimization logic of the augmented scheduler of FIG. 5, in accordance with one implementation of the present invention.

FIG. 7 illustrates the logical flow of the probabilistic combination procedure, beginning with optimization logic and throttle control 106 generating a random number (140). The random number is first compared to the first threshold (142). If the random number is less than the first threshold, the read/write ratio state machine is used (144). Otherwise the random number is next compared to the second threshold (146). If the random number is greater than or equal to the first threshold but less than the second threshold, the expected latency state machine is used (148). If the random number is greater than or equal to the second threshold, the power priority state machine is used (150). The selected state machine is used for a predetermined interval (152), after which the procedure repeats with the generation of a new random number.

This algorithm interleaves the three state machines into a single scheduler. Optimum threshold values are system-dependent and may be determined experimentally, but this scheduler may also be manipulated to force usage of only one or two of the state machines by appropriate selection of the first and second threshold values.

The foregoing power-down mechanism provides significant power savings, but for additional power conservation memory controller 70 uses a throttling mechanism that blocks commands to the DRAM for a period of time necessary to achieve a desired power target. In the illustrative implementation, commands for all ranks 72 are blocked by optimization logic and throttle control 106 for T clock cycles, but other implementations could power-down selected ranks (single or multiple). Commands that are blocked cannot proceed to CAQ 82 and so accumulate in reorder queues 76, thereby reducing bandwidth between the memory controller and the DRAM. When combined with a power-down mechanism, this throttling allows a rank to be powered-down for almost T cycles. If T is sufficiently long, the reorder queues become filled with commands for the blocked rank, and the system stalls. Thus, by changing the value of T, the system's average power consumption may be arbitrarily lowered.

To reduce DRAM power consumption to a target level, accurate estimation of the throttling delay T is critical. An inaccurate model for T can cause two problems: (i) if T is overestimated, power consumption will be lower than the target, but at the same time performance will degrade more than it is necessary; and (ii) if T is underestimated, power consumption will be higher than the target. This latter problem can be solved by choosing a lower target for power when estimating T. However, such a conservative approach will also degrade performance unnecessarily. Memory controller 70 estimates the throttling delay that will reduce DRAM power consumption to a predetermined level, and thereby cause as small a performance degradation as possible, using a regression model. In the illustrative implementation, the regression model bases throttling delay on four operating factors: the power target, the number of recent read commands, the number of recent write commands, and the number of bank conflicts (the number of cycles where no command can be transmitted from the reorder queues to the command queue due to a bank conflict). The relationship between power consumption and T is non-linear, and using only target power level to predict T will cause unnecessary performance degradation. For example, in a scheduler that injects a throttling delay for every 10,000 clock cycles and for a target power consumption of 40 Watts, the appropriate value of T varies between about 500 and 5,000 cycles. Experiments indicate that the number of bank conflicts, together with the number of current reads and writes, is a superior representation for the power effects of the offset between data streams.

Linear regression is thus used to develop models for throttling delay by presenting a system of equations where the known values are measured DRAM power, throttling delay, number of reads, number of writes, and number of bank conflicts. This model is explicitly defined by the equation:

$$y_i = \beta_0 + \beta_1 P_i + \beta_2 R_i + \beta_3 W_i + \beta_4 B_i, \quad i=1,2,\ldots,n,$$

where n is the number of training sets, P is the power target, R is the number of reads, W is the number of writes, B is the number of bank conflicts, and y is the throttling delay for the training set. The unknowns in the system are the model coefficients $\beta_0$-$\beta_4$. This equation can also be stated in matrix form as $$y = \Phi \beta$$

where $\Phi = [P_i, R_i, W_i, B_i]$ and $\beta = [\beta_0, \beta_1, \beta_2, \beta_3, \beta_4]$. The elements of the $\Phi$ matrix are known, as are the throttling delays y. To find the value of the $\beta$ vector (the regression coefficients), a least squares method is used in which $$\beta = \Phi^+ y$$

where $\Phi^+$ is the pseudo-inverse of $\Phi$ (the pseudo-inverse of a matrix is a known function in linear algebra). Solving this system yields the values of the model coefficients. The system may be trained and evaluated using program instructions which reside on a data processing system generally similar to computer system 20.

The model coefficients vary depending on the processor frequency and DRAM properties, so if the system configuration changes these coefficients should be regenerated. This model is a first-order (linear) regression model because the exponent of each variable ($P_i$, $R_i$, $W_i$, $B_i$) is one. Other, more complicated regression models can be used which include higher-order (e.g., quadratic) and cross-product terms.

Figure 8:
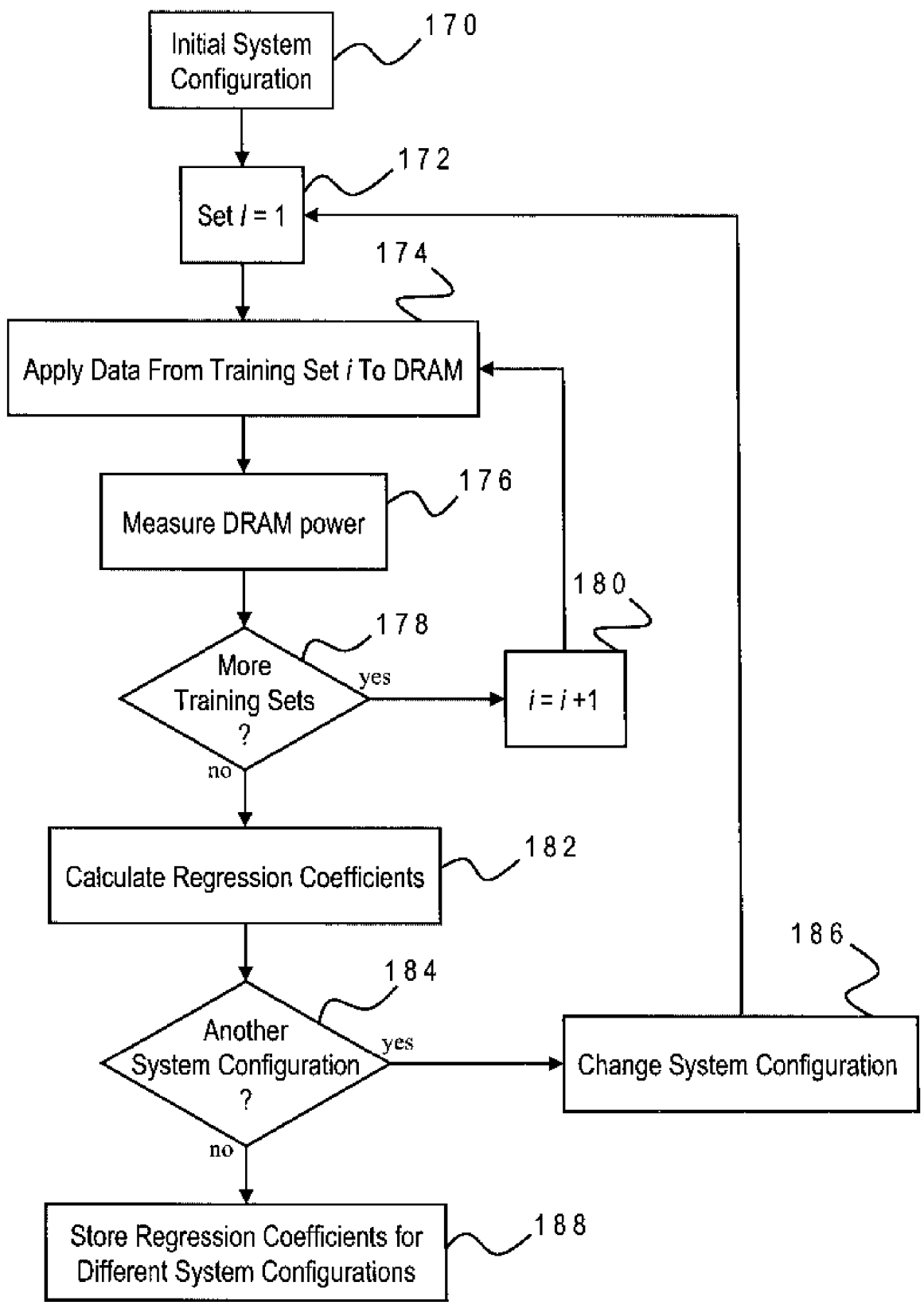
FIG. 8 is a flow chart illustrating the calculation of regression coefficients for different regression models used with different system configurations by the throttling delay logic of FIG. 9, in accordance with one implementation of the present invention.

The process for modeling the throttling delay may be further understood with reference to the flow chart of FIG. 8, which begins with an initial system configuration (170). For the first training set of data used with this configuration, the training set counter i is set to one (172). Data from the first training set is then applied to the DRAM, i.e., memory commands that present a known number of reads, a known number of writes, a known number of bank conflicts, and a known throttling delay (174), and the DRAM power consumption is measured (176). If there are more training sets (178) the training set counter i is incremented (178) and steps 174 and 176 are repeated. Once all training data has been entered, the regression coefficients are calculated (182). The model may be applied to other system configurations (184) in which case the changes are made to the system configuration (186) and steps 172 through 182 are repeated. The regression coefficients for the different system configurations are then stored to be used later in tables by the operating system (188).

Figure 9:
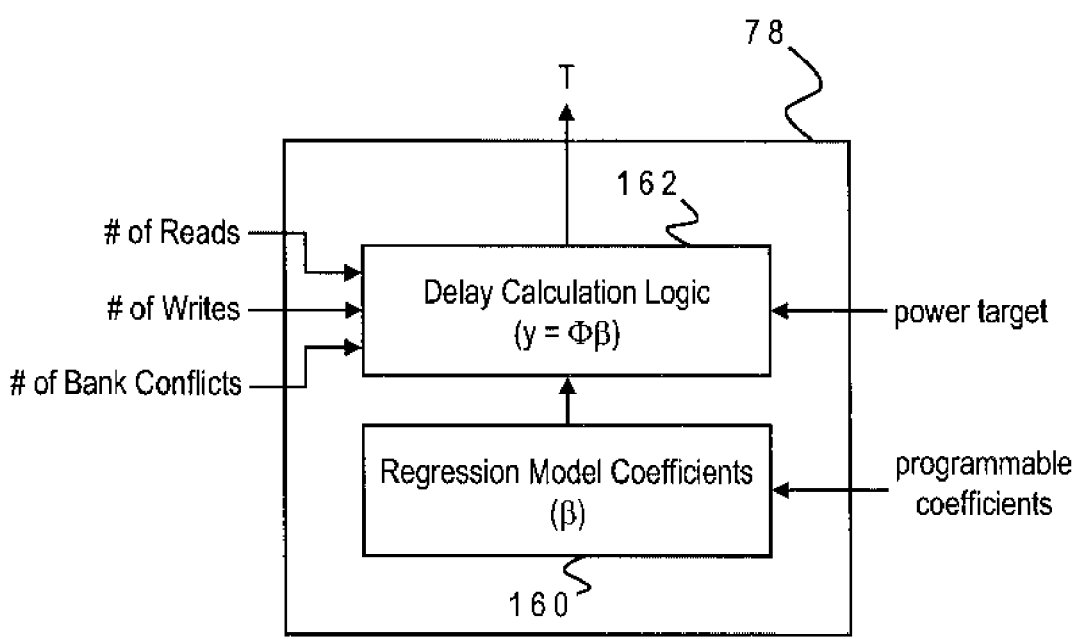
FIG. 9 is a block diagram of one embodiment of the throttling delay logic used in the memory controller of FIG. 3, constructed in accordance with the present invention.

FIG. 9 depicts in further detail the throttling delay logic 78 of memory controller 70 which calculates the throttling delay T. Throttling delay logic 78 includes a data structure 160 such as electronically-erasable, programmable read-only memory (EEPROM) which stores regression coefficients ($\beta$) for the current system configuration. Data structure 160 is programmed with the coefficients by the OS which uses tables to map different system configurations to different coefficients. The regression coefficients are provided by data structure 160 to delay calculation logic 162 which also receives Rcnt, Wcnt, Bcnt, and the power target. The power target can be set manually or adjusted dynamically by the OS depending upon various parameters. The regression coefficients and power target may be communicated to throttling delay logic 78 via system interconnect fabric 26 or by other communications channels between processor(s) 22 and memory controller 70, such as a scan ring controlled by processor(s) 22 or by a service processor. Delay calculation logic 162 uses the aforementioned formula $y = \beta_0 + \beta_1 P + \beta_2 R + \beta_3 W + \beta_4 B$ to derive the estimated throttling delay T. The throttling delay is forwarded to optimization logic and throttle control 106 which then blocks the issuance of commands to CAQ 82 for the number of cycles specified by T. The memory ranks are powered down during the throttle delay (by power-down unit 86).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of hardware-based power management, it may be adapted for software-based power management or combined with software features to form a hybrid power management system. It is therefore contemplated that such modifications can be made without departing from the spirit or scope of the present invention as defined in the appended claims.

What is claimed is:

1. A method of managing power usage of a memory device, comprising:
   setting a target power consumption for the memory device;
   estimating a throttling delay for achieving the target power consumption;
   periodically blocking memory commands to one or more selected ranks of the memory device for a number of clock cycles corresponding to the throttling delay; and
   powering down the selected ranks while the memory commands are blocked.

2. The method of claim 1 wherein said estimating includes using a regression model which bases the throttling delay on a plurality of operating factors including power consumption, and a plurality of regression coefficients for the operating factors.

3. The method of claim 2 wherein the operating factors further include a current number of bank conflicts for the memory device.

4. The method of claim 2 wherein the operating factors further include a current number of read commands and a current number of write commands for the memory device.

5. The method of claim 2, further comprising programmably storing the regression coefficients for use with a current system configuration.

6. The method of claim 2, further comprising calculating the regression coefficients by:
   constructing a matrix $\Phi$ of training sets for the operating factors resulting in respective throttling delays y; and
   computing the regression coefficients $\beta$ as $$\beta = \Phi^+ y$$

where $\Phi^+$ is the pseudo-inverse of $\Phi$.

7. The method of claim 1 wherein all memory ranks of the memory device are block for the number of clock cycles.

8. The method of claim 1, further comprising:
   receiving a plurality of memory commands directed to the memory device;
   determining power priorities for the memory commands;
   reordering the memory commands for dispatch to the memory device based on the power priorities; and
   powering down one or more further selected memory ranks based on rank localities of the reordered commands.

9. A memory controller for a memory device, comprising:
throttling delay logic which estimates a throttling delay for achieving a target power consumption for the memory device;
a scheduler which periodically blocks memory commands to one or more selected ranks of the memory device for a number of clock cycles corresponding to the throttling delay; and
a power-down unit which issues a power-down command to the memory device addressed to the selected memory ranks while the memory commands are blocked.

10. The memory controller of claim 9 wherein said throttling delay logic uses a regression model which bases the throttling delay on a plurality of operating factors including power consumption, and a plurality of regression coefficients for the operating factors.

11. The memory controller of claim 10 wherein the operating factors further include a current number of bank conflicts for the memory device.

12. The memory controller of claim 10 wherein the operating factors further include a current number of read commands and a current number of write commands for the memory device.

13. The memory controller of claim 10 wherein the regression coefficients are programmably stored in said throttling delay logic for use with a current system configuration.

14. The memory controller of claim 10 wherein the regression coefficients are calculated by:
constructing a matrix $\Phi$ of training sets for the operating factors resulting in respective throttling delays y; and
computing the regression coefficients $\beta$ as $$\beta = \Phi^+ y$$

where $\Phi^+$ is the pseudo-inverse of $\Phi$.

15. The memory controller of claim 9 wherein said scheduler blocks all memory ranks of the memory device for the number of clock cycles.

16. The memory controller of claim 9 wherein:
said scheduler includes a state machine which determines power priorities for a plurality of memory commands directed to the memory device, and reorders the memory commands for dispatch to the memory device based on the power priorities; and
said power-down unit issues a power-down command to the memory device addressed to one or more further selected memory ranks based on rank localities of the reordered commands.

17. A computer system comprising:
one or more processors which process program instructions;
a memory device connected to said one or more processors; and
a memory controller which estimates a throttling delay for achieving a target power consumption for said memory device, periodically blocks memory commands to one or more selected ranks of said memory device for a number of clock cycles corresponding to the throttling delay, and issues a power-down command to said memory device addressed to the selected memory ranks while the memory commands are blocked.

18. The computer system of claim 17 wherein said memory controller uses a regression model which bases the throttling delay on a plurality of operating factors and a plurality of regression coefficients for the operating factors, the operating factors including:
target power consumption;
a current number of read commands for the memory device;
a current number of write commands for the memory device; and
a current number of bank conflicts for the memory device.

19. The computer system of claim 18 wherein the regression coefficients are programmably stored in said memory controller for use with a current system configuration, and are calculated by:
constructing a matrix $\Phi$ of training sets for the operating factors resulting in respective throttling delays y; and
computing the regression coefficients $\beta$ as $$\beta = \Phi^+ y$$

where $\Phi^+$ is the pseudo-inverse of $\Phi$.

20. A method of modeling throttled power consumption of a memory device, comprising:
constructing a matrix $\Phi$ of training sets for a plurality of operating factors resulting in respective throttling delays y, wherein the operating factors include power consumption;
computing regression coefficients $\beta$ for the operating factors as $$\beta = \Phi^+ y$$

where $\Phi^+$ is the pseudo-inverse of $\Phi$; and
storing the regression coefficients.

* * * * *